(12) United States Patent
Matsukawa et al.

(10) Patent No.: US 11,522,496 B2
(45) Date of Patent: Dec. 6, 2022

(54) OSCILLATOR

(71) Applicant: SEIKO EPSON CORPORATION, Tokyo (JP)

(72) Inventors: Norihito Matsukawa, Shimosuwa-machi (JP); Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/387,172

(22) Filed: Jul. 28, 2021

(65) Prior Publication Data

US 2022/0038055 A1 Feb. 3, 2022

(30) Foreign Application Priority Data

Jul. 30, 2020 (JP) .............................. JP2020-129648

(51) Int. Cl.
*H03B 5/32* (2006.01)
*H03B 5/04* (2006.01)
*H03L 1/04* (2006.01)
*H01L 41/053* (2006.01)
*H03L 1/02* (2006.01)

(52) U.S. Cl.
CPC .............. *H03B 5/04* (2013.01); *H01L 41/053* (2013.01); *H03B 5/32* (2013.01); *H03B 5/323* (2013.01); *H03L 1/028* (2013.01); *H03L 1/04* (2013.01)

(58) Field of Classification Search
CPC ..... H01L 41/053; H01L 41/083; H01L 41/23; H03B 5/04; H03B 5/30; H03B 5/32; H03H 9/05; H03H 9/0538; H03H 9/0547; H03H 9/0552; H03H 9/0561; H03H 9/059; H03H 9/08; H03H 9/10; H03L 1/00; H03L 1/02; H03L 1/022; H03L 1/026; H03L 1/028; H03L 1/04
USPC .............................. 331/68, 69, 154, 158, 176
See application file for complete search history.

(56) References Cited

U.S. PATENT DOCUMENTS

| | | | | |
|---|---|---|---|---|
| 6,621,361 B1* | 9/2003 | Fry | ........................... | H03L 1/04 331/158 |
| 6,731,180 B1* | 5/2004 | Clark | ........................ | H03L 1/04 310/341 |
| 2006/0081605 A1* | 4/2006 | Oita | ................... | G05D 23/1913 219/494 |
| 2006/0192626 A1* | 8/2006 | Milliren | ..................... | H03L 1/04 331/158 |
| 2006/0237426 A1* | 10/2006 | Matsuoka | ................. | H03L 1/04 219/400 |

(Continued)

FOREIGN PATENT DOCUMENTS

JP 2017-175202 9/2017

*Primary Examiner* — Levi Gannon
(74) *Attorney, Agent, or Firm* — Rankin, Hill & Clark LLP (57) ABSTRACT

An oscillator includes: an outer package; an inner package accommodated in the outer package and fixed to the outer package via a heat insulating member; a vibration element accommodated in the inner package; a temperature sensor; a first circuit element accommodated in the inner package and including an oscillation circuit configured to oscillate the vibration element and generate a temperature-compensated oscillation signal based on the temperature sensor; and a second circuit element fixed to the outer package and including a frequency control circuit configured to control a frequency of the oscillation signal.

19 Claims, 6 Drawing Sheets

(56) References Cited

U.S. PATENT DOCUMENTS

| | | | |
|---|---|---|---|
| 2010/0164635 A1* | 7/2010 | Kudo | H05K 1/0212 |
| | | | 331/158 |
| 2015/0180445 A1* | 6/2015 | Isohata | H03B 5/04 |
| | | | 331/70 |
| 2017/0230003 A1* | 8/2017 | Kikuchi | H03H 9/13 |
| 2017/0272081 A1* | 9/2017 | Chiang | H01L 23/345 |
| 2017/0272083 A1 | 9/2017 | Owaki et al. | |
| 2017/0373637 A1* | 12/2017 | Kondo | H03H 9/08 |

* cited by examiner

OSCILLATOR

The present application is based on, and claims priority from JP Application Serial Number 2020-129648, filed Jul. 30, 2020, the disclosure of which is hereby incorporated by reference herein in its entirety.

BACKGROUND

1. Technical Field

The present disclosure relates to an oscillator.

2. Related Art

JP-A-2017-175202 discloses an oscillator including an outer package, an inner package accommodated in the outer package, a vibration element accommodated in the inner package, and a circuit element accommodated in the outer package and disposed on the inner package. The oscillator in JP-A-2017-175202 includes a temperature sensor in the circuit element, and corrects a frequency of an output signal based on a temperature detected by the temperature sensor.

However, in the oscillator in JP-A-2017-175202, since the circuit element including the temperature sensor is located outside the inner package accommodating the vibration element, a temperature difference between the temperature sensor and the vibration element is likely to occur, and it is difficult to correct the output signal with high accuracy. Therefore, frequency accuracy of the output signal may decrease.

SUMMARY

An oscillator according to the present disclosure includes: an outer package; an inner package accommodated in the outer package and fixed to the outer package via a heat insulating member; a vibration element accommodated in the inner package; a temperature sensor; a first circuit element accommodated in the inner package and including an oscillation circuit configured to oscillate the vibration element and generate a temperature-compensated oscillation signal based on the temperature sensor; and a second circuit element fixed to the outer package and including a frequency control circuit configured to control a frequency of the oscillation signal.

DESCRIPTION OF EXEMPLARY EMBODIMENTS

Hereinafter, preferred embodiments of an oscillator according to the present disclosure will be described in detail with reference to the accompanying drawings.

First Embodiment

Figure 1:
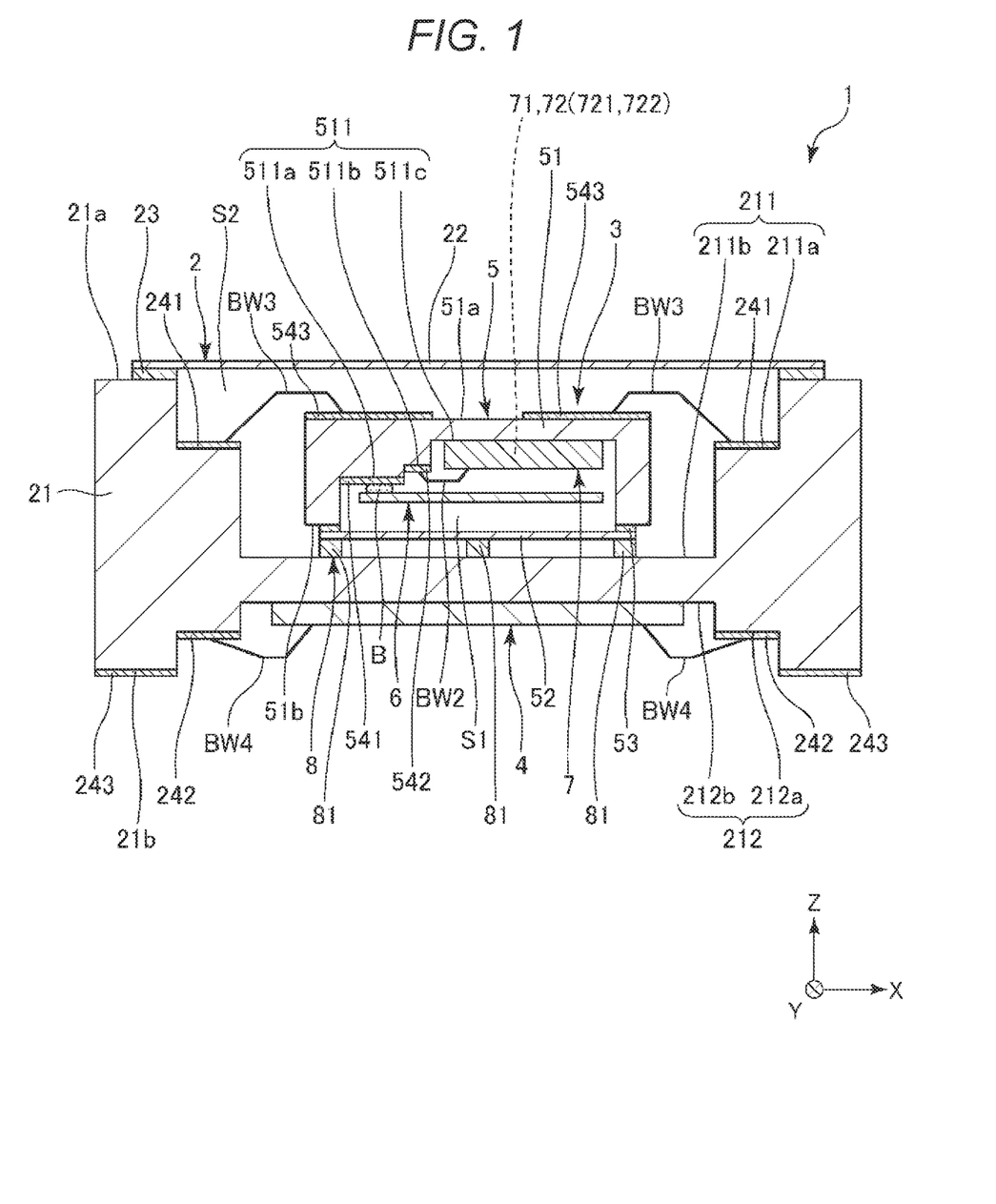
FIG. 1 is a cross-sectional view showing an oscillator according to a first embodiment.
Figure 2:
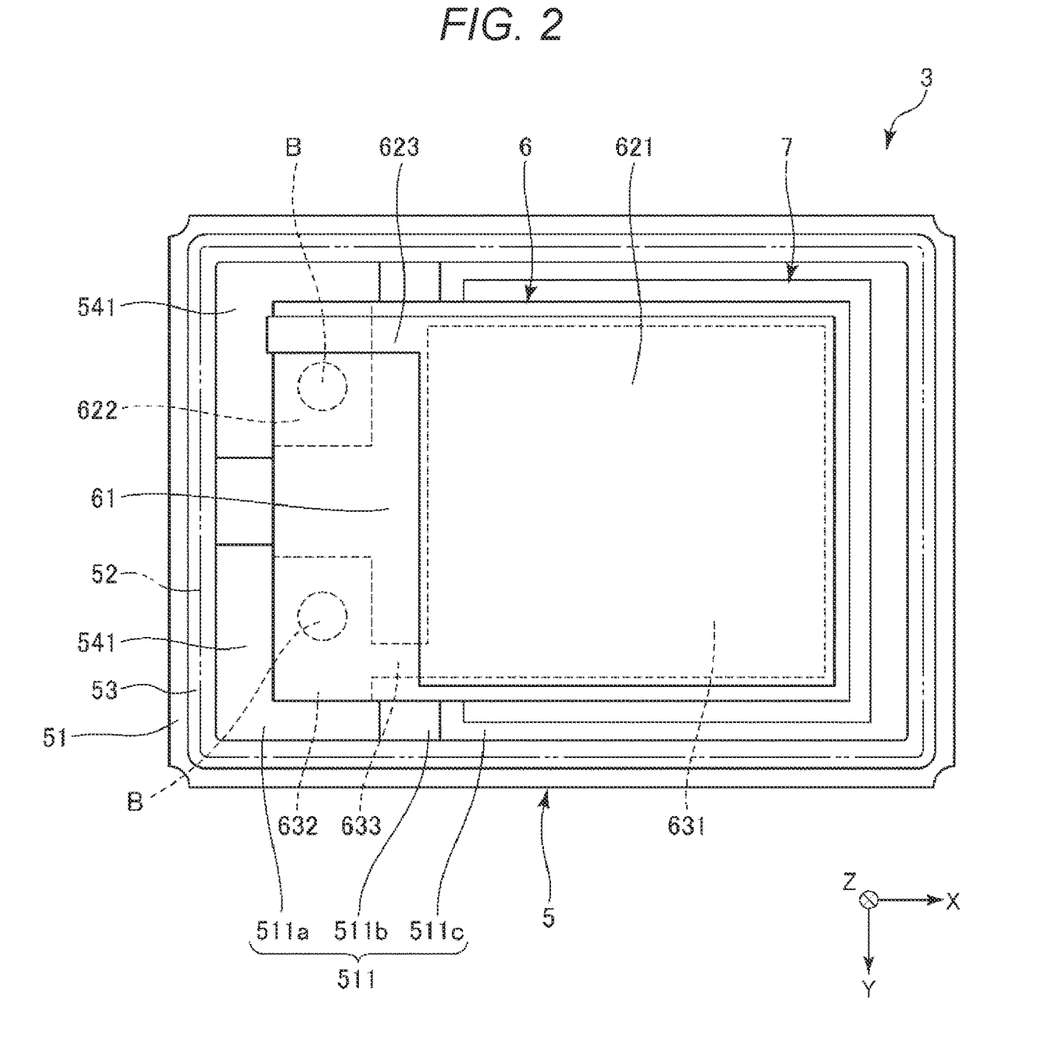
FIG. 2 is a plan view showing the inside of an inner package included in the oscillator in FIG. 1.
Figure 3:
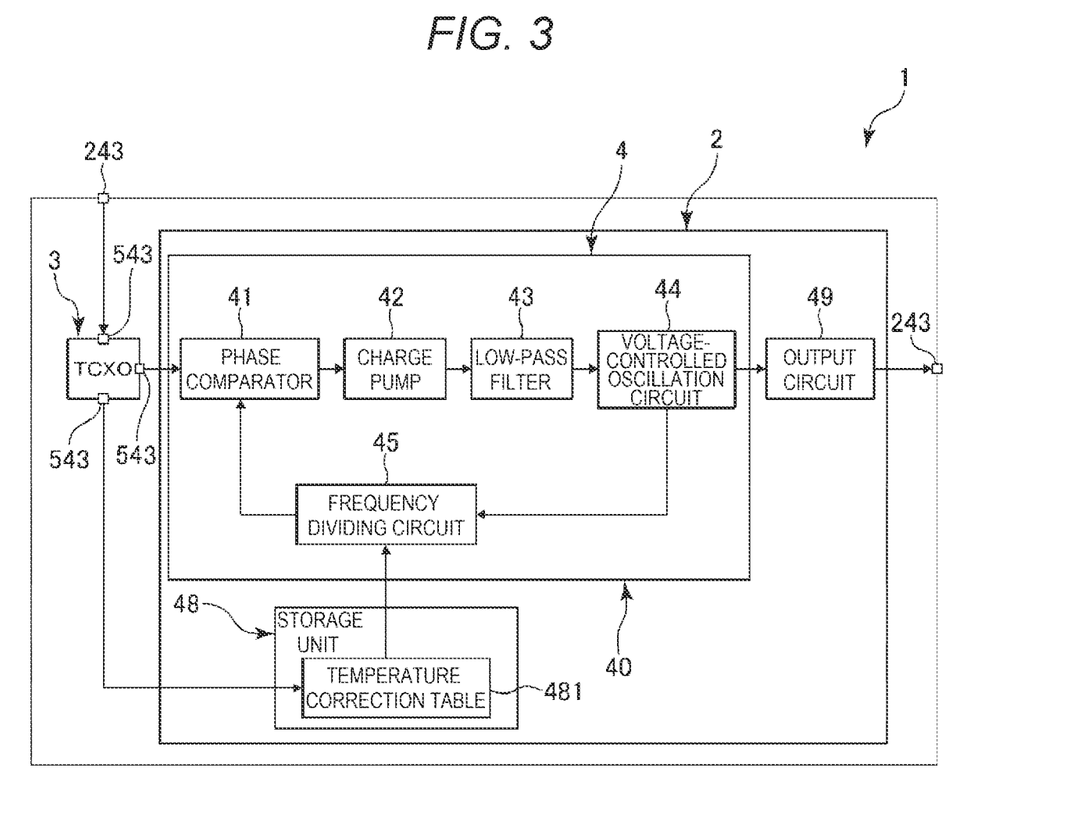
FIG. 3 is a circuit diagram of a second circuit element included in the oscillator in FIG. 1.

FIG. 1 is a cross-sectional view showing an oscillator according to a first embodiment. FIG. 2 is a plan view showing the inside of an inner package included in the oscillator in FIG. 1. FIG. 3 is a circuit diagram of a second circuit element included in the oscillator in FIG. 1. For convenience of description, an X-axis, a Y-axis, and a Z-axis orthogonal to one another are illustrated in FIGS. 1 and 2. A direction along the X-axis is also referred to as an X-axis direction, a direction along the Y-axis is also referred to as a Y-axis direction, and a direction along the Z-axis is also referred to as a Z-axis direction. An arrow side in the Z-axis direction which is a thickness direction of an oscillator 1 is also referred to as "upper", and an opposite side thereof is also referred to as "lower". Further, a plan view from the Z-axis direction is also simply referred to as a "plan view".

The oscillator 1 shown in FIG. 1 includes an outer package 2, a temperature compensated crystal oscillator 3 (TCXO), and a second circuit element 4. The temperature compensated crystal oscillator 3 includes an inner package 5, and a vibration element 6 and a first circuit element 7 accommodated in the inner package 5.

The outer package 2 includes a second base substrate 21. The second base substrate 21 has an upper surface 21a and a lower surface 21b that are in a front and back relationship. The second base substrate 21 includes a bottomed recess 211 which is a second recess that opens to the upper surface 21a, and a bottomed recess 212 which is a third recess that opens to the lower surface 21b. Therefore, the second base substrate 21 has an H-shaped cross section. The recess 211 includes a plurality of recesses, and includes a recess 211a that is open to the upper surface 21a and a recess 211b that is open to the bottom surface of the recess 211a and has an opening smaller than that of the recess 211a. The recess 212 includes a plurality of recesses, and includes a recess 212a that is open to the lower surface 21b and a recess 212b that is open to the bottom surface of the recess 212a and has an opening smaller than that of the recess 212a. The temperature compensated crystal oscillator 3 is fixed to the bottom surface of the recess 211b via a heat insulating member 8, and the second circuit element 4 is fixed to the bottom surface of the recess 212b.

A plurality of internal terminals 241 are disposed on the bottom surface of the recess 211a. A plurality of internal terminals 242 are disposed on the bottom surface of the recess 212a. A plurality of mounting terminals 243 are disposed on the lower surface 21b. The terminals 241, 242, and 243 are electrically coupled to one another via an internal wiring (not shown) formed in the second base substrate 21. Each internal terminal 241 is electrically coupled to the inner package 5 via a bonding wire BW3. Each internal terminal 242 is electrically coupled to the second circuit element 4 via a bonding wire BW4. The oscillator 1 is electrically coupled to an external device (not shown) via the plurality of mounting terminals 243.

The outer package 2 includes a second lid 22. The second lid 22 is bonded to the upper surface 21a of the second base substrate 21 via a bonding member 23, and closes the opening of the recess 211. By closing the opening of the recess 211 with the second lid 22 in this manner, an airtight second accommodation space S2 is formed inside the outer package 2. The temperature compensated crystal oscillator 3 is accommodated in the second accommodation space S2.

The second accommodation space S2 is in a depressurized state, preferably in a state closer to vacuum. Accordingly, heat insulating property of the outer package 2 is increased, and the oscillator 1 is less likely to be affected by an external temperature. Heat exchange between the temperature compensated crystal oscillator 3 disposed in the second accommodation space S2 and the second circuit element 4 disposed outside the second accommodation space S2, in particular, heat exchange due to convection, is prevented. Therefore, it is possible to prevent a temperature sensor 71 included in the first circuit element 7 and the vibration element 6 from being unevenly heated by the heat of the second circuit element 4. That is, it is possible to prevent occurrence of a temperature difference between the vibration element 6 and the temperature sensor 71 due to the heat of the second circuit element 4. Therefore, the oscillator 1 with high accuracy can be obtained.

An atmosphere of the second accommodation space S2 is not particularly limited, and may be, for example, an atmosphere in which an inert gas such as nitrogen, argon, or helium is sealed, or may be an atmospheric pressure state or a pressurized state instead of the depressurized state. As in embodiments to be described below, the second accommodation space S2 may be filled with the heat insulating member 8.

Although not particularly limited, the second base substrate 21 can be made of ceramics such as alumina. The second lid 22 can be made of a metal material such as Kovar.

As shown in FIG. 1, the temperature compensated crystal oscillator 3 includes the inner package 5, and the vibration element 6 and the first circuit element 7 accommodated in the inner package 5.

The inner package 5 includes a first base substrate 51. The first base substrate 51 has an upper surface 51a and a lower surface 51b that are in the front and back relationship. The first base substrate 51 has a bottomed recess 511 which is a first recess that opens to the lower surface 51b. The recess 511 includes a plurality of recesses, and includes a recess 511a that opens to the lower surface 51b, a recess 511b that opens to a bottom surface of the recess 511a and has an opening smaller than that of the recess 511a, and a recess 511c that opens to a bottom surface of the recess 511b and has an opening smaller than that of the recess 511b.

The first circuit element 7 is fixed to a bottom surface of the recess 511c. The vibration element 6 is fixed to the bottom surface of the recess 511a. According to such an arrangement, the vibration element 6 and the first circuit element 7 can be disposed to overlap each other in the Z-axis direction in the inner package 5. Therefore, components can be compactly accommodated in the inner package 5. The temperature compensated crystal oscillator 3 can be miniaturized. The arrangement for the vibration element 6 is not limited thereto, and for example, may be fixed to an upper surface of the first circuit element 7. Further, the vibration element 6 and the first circuit element 7 may be disposed side by side in the X-axis direction or the Y-axis direction.

A plurality of internal terminals 541 are disposed on the bottom surface of the recess 511a. A plurality of internal terminals 542 are disposed on the bottom surface of the recess 511b. A plurality of external terminals 543 are disposed on the upper surface 51a. The terminals 541, 542, and 543 are electrically coupled to one another via an internal wiring (not shown) formed in the first base substrate 51. Each of the plurality of external terminals 543 is electrically coupled to the internal terminal 241 of the second base substrate 21 via the bonding wire BW3. In this way, by providing the external terminals 543 facing the outside of the inner package 5, the electrical coupling between the inner package 5 and the outer package 2 becomes easy.

Since the conductive member electrically coupling the inner package 5 and the outer package 2 has high thermal conductivity, the conductive member easily functions as a heat transfer path between the inner package 5 and the outer package 2. Therefore, by using thin and long linear bonding wire BW3 as the conductive member, heat transfer between the inner package 5 and the outer package 2 can be effectively prevented. Therefore, external heat is less likely to be transferred to the inner package 5. Therefore, the vibration element 6 is less likely to be affected by the external heat. A temperature change of the vibration element 6 can be prevented, and the temperature difference between the vibration element 6 and the temperature sensor 71 can be reduced to be small.

The inner package 5 includes a first lid 52. The first lid 52 is bonded to the lower surface 51b of the first base substrate 51 via a bonding member 53, and closes the opening of the recess 511. In this way, by closing the opening of the recess 511 with the first lid 52, an airtight first accommodation space S1 is formed inside the inner package 5. The vibration element 6 and the first circuit element 7 are accommodated in the first accommodation space S1.

The first accommodation space S1 is in the depressurized state, preferably in a state closer to vacuum. Accordingly, a crystal impedance (CI) value of the vibration element 6 decreases, and oscillation characteristics are improved. An atmosphere of the first accommodation space S1 is not particularly limited, and may be, for example, an atmospheric pressure state or a pressurized state.

Although not particularly limited, the first base substrate 51 can be made of ceramics such as alumina. The first lid 52 can be made of a metal material such as Kovar.

The inner package 5 is disposed in a posture in which the first lid 52 faces the bottom surface side of the recess 211, that is, a negative side in the Z-axis direction, and is fixed to the bottom surface of the recess 211 via the heat insulating member 8 in the first lid 52. In this way, by interposing the heat insulating member 8 between the inner package 5 and the outer package 2, the external heat, particularly the heat of the second circuit element 4, is less likely to be transferred to the inner package 5 via the outer package 2. Therefore, the vibration element 6 is hardly affected by the external heat. It is possible to effectively prevent the occurrence of the temperature difference between the vibration element 6 and the temperature sensor 71 due to the external heat. Accordingly, the temperature of the vibration element 6 can be more accurately detected by the temperature sensor 71, and excellent temperature compensation can be performed.

In particular, by fixing the first lid 52 to which the vibration element 6 is not fixed among the members constituting the inner package 5 to the outer package 2, it is possible to lengthen the heat transfer path from the heat insulating member 8 to the vibration element 6. Therefore, even when the external heat is transferred to the inner package 5 via the heat insulating member 8, the heat is less likely to be transferred to the vibration element 6. Therefore, the vibration element 6 is less likely to be affected by the external heat. It is possible to more effectively prevent the occurrence of the temperature difference between the vibration element 6 and the temperature sensor 71 due to the external heat. The present disclosure is not limited thereto, and the first base substrate 51 may be fixed to the second base substrate 21 via the heat insulating member 8.

The heat insulating member 8 is made of a material having the thermal conductivity lower than that of the first lid 52. The material for the heat insulating member 8 is not particularly limited, and for example, various resin materials, particularly, a porous resin material such as porous polyimide can be suitably used. In addition to the resin material, various glass materials, an inorganic porous material such as silica aerogel, and the like can be used. The thermal conductivity of the heat insulating member 8 is not particularly limited, but is preferably 1.0 W/m·K or less. Accordingly, the heat insulating member 8 having a sufficiently low thermal conductivity is obtained.

The heat insulating member 8 includes a plurality of columnar portions 81 disposed to be separated from each other. The columnar portions 81 are disposed in an island shape so as to spread over the entire region of the first lid 52. Accordingly, the inner package 5 can be fixed to the outer package 2 in a stable posture. A contact area between the heat insulating member 8 and the outer package 2 can be reduced. The external heat is less likely to be transferred to the inner package 5 via the heat insulating member 8. The present disclosure is not limited thereto, and the heat insulating member 8 may be spread over the entire lower surface of the first lid 52 and may be disposed in a solid manner. Accordingly, a bonding area between the inner package 5 and the outer package 2 is increased, and a bonding strength is increased. Therefore, a mechanical strength of the oscillator 1 is increased.

When the heat insulating member 8 has an adhesive force, the first lid 52 and the second base substrate 21 may be bonded to each other via the heat insulating member 8. On the other hand, when the heat insulating member 8 does not have the adhesive force, the heat insulating member 8 and the first lid 52 may be bonded to each other, and the heat insulating member 8 and the second base substrate 21 may be bonded to each other via a bonding member such as an adhesive. The heat insulating member 8 may include a gap material having a sufficiently low thermal conductivity, such as silica gel. Accordingly, a thickness of the heat insulating member 8 can be controlled, and heat insulating effect can be more reliably exhibited.

The vibration element 6 is an AT-cut crystal vibration element. The AT-cut crystal vibration element has excellent frequency stability since the AT-cut crystal vibration element has a third-order frequency temperature characteristic. As shown in FIG. 2, the vibration element 6 includes a rectangular crystal substrate 61 cut out by an AT-cut, and an electrode disposed on a surface of the crystal substrate 61. The electrode includes a first excitation electrode 621 disposed on a lower surface of the crystal substrate 61 and a second excitation electrode 631 that is disposed on an upper surface of the crystal substrate 61 and that is opposed to the first excitation electrode 621 via the crystal substrate 61. The electrode is at the lower surface of the crystal substrate 61. The electrode includes a first pad electrode 622 and a second pad electrode 632 disposed side by side on an edge of the crystal substrate 61, a first extraction electrode 623 that is electrically coupled to the first excitation electrode 621 and the first pad electrode 622, and a second extraction electrode 633 that is electrically coupled to the second excitation electrode 631 and the second pad electrode 632.

The configuration of the vibration element 6 is not particularly limited. For example, a plan view shape of the crystal substrate 61 is not limited to a rectangular shape, and may be a circular shape. In addition to the AT-cut crystal vibration element, an SC-cut crystal vibration element, a BT-cut crystal vibration element, a tuning-fork type crystal vibration element, an elastic surface wave resonator, another piezoelectric vibration element, a micro electro mechanical systems (MEMS) resonance element, or the like may be used as the vibration element 6.

Instead of the crystal substrate 61, various piezoelectric substrates such as lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenic (GaAs), aluminum nitride (AlN), zinc oxide (ZnO, $Zn_2O_3$), barium titanate ($BaTiO_3$), lead titanate ($PbPO_3$), potassium niobate ($(K,Na)NbO_3$), bismuth ferrite ($BiFeO_3$), sodium niobate ($NaNbO_3$), bismuth titanate ($Bi_4Ti_3O_{12}$), sodium bismuth titanate ($Na_{0.5}Bi_{0.5}TiO_3$) may be used. For example, a substrate other than the piezoelectric substrate such as a silicon substrate may be used.

One end portion of the vibration element 6 is bonded to the bottom surface of the recess 511a via a pair of conductive bonding members B. The first pad electrode 622 and the second pad electrode 632 are electrically coupled to the internal terminal 541 via the pair of bonding members B. The bonding member B is not particularly limited. For example, a conductive bonding member represented by a metal bump, a solder, a brazing material, a metal paste, or a conductive resin adhesive can be used.

The first circuit element 7 is electrically coupled to the internal terminal 542 via the bonding wire BW2. The first circuit element 7 includes the temperature sensor 71 and an oscillation circuit 72. The oscillation circuit 72 has a function of oscillating the vibration element 6 and generating a temperature-compensated oscillation signal based on the temperature detected by the temperature sensor 71. That is, the oscillation circuit 72 includes an oscillation circuit unit 721 that is electrically coupled to the vibration element 6, amplifies an output signal of the vibration element 6, and feeds back the amplified signal to the vibration element 6 to oscillate the vibration element 6, and a temperature compensation circuit unit 722 that performs temperature compensation based on temperature information output from the temperature sensor 71 so that frequency variation of the output signal is smaller than the frequency temperature characteristic of the vibration element 6 itself.

As the oscillation circuit 72, for example, an oscillation circuit such as a Pierce oscillation circuit, an inverter type oscillation circuit, a Colpitts oscillation circuit, or a Hartley oscillation circuit can be used. The temperature compensation circuit unit 722 included in the oscillation circuit 72 may be, for example, one that adjusts an oscillation frequency of the oscillation circuit unit 721 by adjusting a capacitance of a variable capacitance circuit coupled to the oscillation circuit unit 721, or one that adjusts the frequency of the output signal of the oscillation circuit unit 721 by a PLL circuit or a direct digital synthesizer circuit.

In this manner, by accommodating both the temperature sensor 71 and the vibration element 6 in the inner package 5, the temperature sensor 71 can be disposed in the same space as the vibration element 6 and in the vicinity of the vibration element 6. Therefore, the temperature of the vibration element 6 can be more accurately detected by the temperature sensor 71, and the temperature compensation by the oscillation circuit 72 becomes more accurate.

In the present embodiment, the temperature sensor is constituted by an IC temperature sensor and is incorporated in the first circuit element 7 which is a single integrated circuit. However, the present disclosure is not limited thereto. That is, the first circuit element 7 may be constituted by an integrated circuit incorporating the oscillation circuit 72 and a discrete component serving as the temperature sensor 71. In this case, the temperature sensor 71 can be constituted by, for example, a thermistor, and a thermocouple. The arrangement of the temperature sensor 71 is not particularly limited as long as the temperature sensor 71 can detect the temperature of the vibration element 6 in the first accommodation space S1. For example, the temperature sensor 71 can be disposed on the upper surface of the first base substrate 51 or the first circuit element 7.

As shown in FIG. 1, the second circuit element 4 is disposed in the recess 212 of the second base substrate 21, and is fixed to the bottom surface of the recess 212. That is, the second circuit element 4 is located outside the second accommodation space S2. The second circuit element 4 is disposed apart from the inner package 5. Accordingly, the heat of the second circuit element 4 is less likely to be transferred to the inner package 5 in the second accommodation space S2. Therefore, the vibration element 6 is less likely to be affected by the heat of the second circuit element 4. The temperature change of the vibration element 6 can be prevented, and the temperature difference between the vibration element 6 and the temperature sensor 71 can be reduced to be small. Since the temperature compensated crystal oscillator 3 and the second circuit element 4 can be disposed to overlap each other in the Z-axis direction, the expansion of the oscillator 1 in the X-axis direction and the Y-axis direction is prevented, and the oscillator 1 can be miniaturized.

As shown in FIG. 3, the second circuit element 4 includes a fractional frequency division type PLL circuit 40 (phase synchronization circuit) as a frequency control circuit that controls the frequency of the oscillation signal output from the oscillation circuit 72 and further corrects the frequency temperature characteristic remaining in the oscillation signal output from the temperature compensated crystal oscillator 3, a storage unit 48 in which a temperature correction table 481 is stored, and an output circuit 49. In the present embodiment, the PLL circuit 40, the storage unit 48, and the output circuit 49 are constituted as a one-chip circuit element. However, the PLL circuit 40, the storage unit 48, and the output circuit 49 may be constituted by a plurality of chip circuit elements, or a part of which may be constituted by discrete components.

The PLL circuit 40 includes a phase comparator 41, a charge pump 42, a low-pass filter 43, a voltage-controlled oscillator circuit 44, and a frequency dividing circuit 45. The phase comparator 41 compares a phase difference between the oscillation signal output from the oscillation circuit 72 and a clock signal output from the frequency dividing circuit 45, and outputs a comparison result as a pulse voltage. The charge pump 42 converts the pulse voltage output from the phase comparator 41 into a current. The low-pass filter 43 smoothes and voltage-converts the current output from the charge pump 42.

The voltage-controlled oscillation circuit 44 uses an output voltage of the low-pass filter 43 as a control voltage, and outputs a signal whose frequency changes in accordance with the control voltage. The voltage-controlled oscillation circuit 44 according to the present embodiment is an LC oscillation circuit constituted by using an inductance element such as a coil and a capacitance element such as a capacitor. The present disclosure is not limited thereto. For example, an oscillation circuit using a piezoelectric oscillator such as a crystal oscillator can be used. The frequency dividing circuit 45 outputs a clock signal obtained by dividing the clock signal output by the voltage-controlled oscillation circuit 44 by a fraction with a frequency dividing ratio determined from the output signal of the temperature sensor 71 and the temperature correction table 481. The frequency dividing ratio of the frequency dividing circuit 45 is not limited to the configuration of being determined by the temperature correction table 481. For example, it may be determined by a polynomial calculation, or may be determined by a neural network operation based on a learned model that is machine-learned.

The clock signal output from the PLL circuit 40 is input to the output circuit 49, and the output circuit 49 generates an oscillation signal whose amplitude is adjusted to a desired level. The oscillation signal generated by the output circuit 49 is output to the outside of the oscillator 1 via the mounting terminals 243 of the oscillator 1.

As described above, by further correcting the frequency temperature characteristic remaining in the oscillation signal output from the temperature compensated crystal oscillator 3 by the PLL circuit 40, the oscillator 1 having smaller frequency deviation due to the temperature can be obtained. The PLL circuit 40 is not particularly limited. For example, an integer frequency division type PLL circuit that divides the oscillation signal output by the oscillation circuit 72 by an integer frequency dividing ratio may be provided between the oscillation circuit 72 and the phase comparator 41. Further, the PLL circuit 40 is not limited to the one that further compensates the temperature of the output signal of the temperature compensated crystal oscillator 3. For example, in order to obtain a desired frequency signal, the PLL circuit 40 may be constituted to multiply an output frequency of the temperature compensated crystal oscillator 3 by a fixed value.

The heat insulating member 8 is interposed between the second circuit element 4 and the temperature compensated crystal oscillator 3. Accordingly, the heat of the second circuit element 4 is less likely to be transferred to the temperature compensated crystal oscillator 3. It is possible to effectively prevent the occurrence of the temperature difference between the vibration element 6 and the temperature sensor 71 due to the heat of the second circuit element 4. Therefore, the temperature of the vibration element 6 can be more accurately detected by the temperature sensor 71. In particular, in the present embodiment, the second circuit element 4 includes the PLL circuit 40. However, the PLL circuit 40 consumes a relatively large amount of power and easily generates heat. Therefore, by interposing the heat insulating member 8 between the second circuit element 4 and the temperature compensated crystal oscillator 3, the above described effect can be more remarkably exhibited. Since the second circuit element 4 also operates based on a temperature information signal output from the temperature sensor 71, the second circuit element 4 is less likely to be affected by its own heat generation.

In addition to the second circuit element 4, a discrete component or another electronic component (not shown) may be fixed to the recess 212. The discrete component is not particularly limited. Examples thereof include a bypass capacitor for removing noise from a power supply voltage supplied via the mounting terminals 243 and supplying a stable power supply voltage to the first circuit element 7, and a bypass capacitor for removing noise from the output signal of the temperature sensor 71 and supplying a more accurate output signal to the PLL circuit 40. In addition, a thermistor, a resistor, a diode, or the like may be used.

The oscillator 1 is described above. As described above, the oscillator 1 includes the outer package 2, the inner package 5 that is accommodated in the outer package 2 and that is fixed to the outer package 2 via the heat insulating member 8, the vibration element 6 accommodated in the inner package 5, the first circuit element 7 that is accommodated in the inner package 5 and that includes the temperature sensor 71 and the oscillation circuit 72 that oscillates the vibration element and generates the temperature-compensated oscillation signal based on the temperature sensor 71, and the second circuit element 4 that is fixed to the outer package 2 and that includes the PLL circuit 40 as the frequency control circuit that controls the frequency of the oscillation signal.

According to such a configuration, since the heat insulating member 8 is interposed between the inner package 5 and the outer package 2, the external heat, particularly the heat of the second circuit element 4, is less likely to be transferred to the inner package 5 via the outer package 2. Therefore, the vibration element 6 is hardly affected by the external heat. It is possible to effectively prevent the occurrence of the temperature difference between the vibration element 6 and the temperature sensor 71 due to the external heat. Accordingly, the temperature of the vibration element 6 can be more accurately detected by the temperature sensor 71, and excellent temperature compensation can be performed by the oscillation circuit 72. By using the PLL circuit 40 as the frequency control circuit, it is possible to output the oscillation signal having the small frequency deviation. Therefore, the oscillator 1 can output a highly accurate frequency signal.

As described above, the second circuit element 4 is disposed apart from the inner package 5. Accordingly, the heat of the second circuit element 4 is less likely to be transferred to the inner package 5. Therefore, the vibration element 6 is less likely to be affected by the heat of the second circuit element 4. The temperature change of the vibration element 6 can be prevented, and the temperature difference between the vibration element 6 and the temperature sensor 71 can be reduced to be small.

As described above, the oscillator 1 includes the bonding wire BW3 which is a conductive wire electrically coupling the outer package 2 and the inner package 5. The conductive member electrically coupling the inner package 5 and the outer package 2 has the high thermal conductivity and easily functions as the heat transfer path between the inner package 5 and the outer package 2. Therefore, by using thin and long linear bonding wire BW3 as the conductive member, heat transfer between the inner package 5 and the outer package 2 can be effectively prevented. Therefore, the external heat is less likely to be transferred to the inner package 5. Therefore, the vibration element 6 is less likely to be affected by the external heat. A temperature change of the vibration element 6 can be prevented, and the temperature difference between the vibration element 6 and the temperature sensor 71 can be reduced to be small.

As described above, the inner package 5 includes the first base substrate 51 having the recess 511, which is the first recess, that accommodates the vibration element 6, the temperature sensor 71, and the first circuit element 7, and the first lid 52 bonded to the first base substrate 51 so as to close the opening of the recess 511. Further, the vibration element 6 is fixed to the first base substrate 51. The first lid 52 is fixed to the outer package 2 via the heat insulating member 8. In this way, by fixing the first lid 52 of the inner package 5 to which the vibration element 6 is not fixed to the outer package 2, it is possible to lengthen the heat transfer path from the heat insulating member 8 to the vibration element 6. Therefore, even if heat is transferred from the outer package 2 to the inner package 5 via the heat insulating member 8, the heat is less likely to be transferred to the vibration element 6. Therefore, the vibration element 6 is less likely to be affected by the external heat. A temperature change of the vibration element 6 can be prevented, and the temperature difference between the vibration element 6 and the temperature sensor 71 can be reduced to be small.

As described above, the inner package 5 includes the external terminal 543 disposed on the upper surface 51*a* which is the surface opposite to the lower surface 51*b* which is the surface to which the first lid 52 of the first base substrate 51 is bonded. Accordingly, the electrical coupling between the inner package 5 and the outer package 2 becomes easy.

As described above, the outer package 2 includes the second base substrate 21 having the recess 211, which is the second recess, that accommodates the inner package 5, and the recess 212, which is the third recess, that accommodates the second circuit element 4 and that opens to the lower surface 21*b* which is the surface opposite to the upper surface 21*a* which is the surface where the recess 211 opens to, and the second lid 22 bonded to the second base substrate 21 so as to close the opening of the recess 211. According to such a configuration, the second circuit element 4 can be disposed outside the second accommodation space S2. The heat of the second circuit element 4 is less likely to be transferred to the inner package 5. Therefore, the vibration element 6 is less likely to be affected by the heat of the second circuit element 4. The temperature change of the vibration element 6 can be prevented, and the temperature difference between the vibration element 6 and the temperature sensor 71 can be reduced to be small. Since the inner package 5 and the second circuit element 4 can be disposed to overlap each other in the Z-axis direction, the expansion of the oscillator 1 in the X-axis direction and the Y-axis direction is prevented, and the oscillator 1 can be miniaturized.

As described above, the second accommodation space S2, which is the space in which the inner package 5 of the outer package 2 is accommodated, is in the depressurized state. Accordingly, the excellent heat insulating property can be exhibited. The external heat of the oscillator 1 is less likely to be transferred to the inner package 5. Therefore, the temperature change of the vibration element 6 can be prevented, and the temperature difference between the vibration element 6 and the temperature sensor 71 can be reduced to be small.

Second Embodiment

Figure 4:
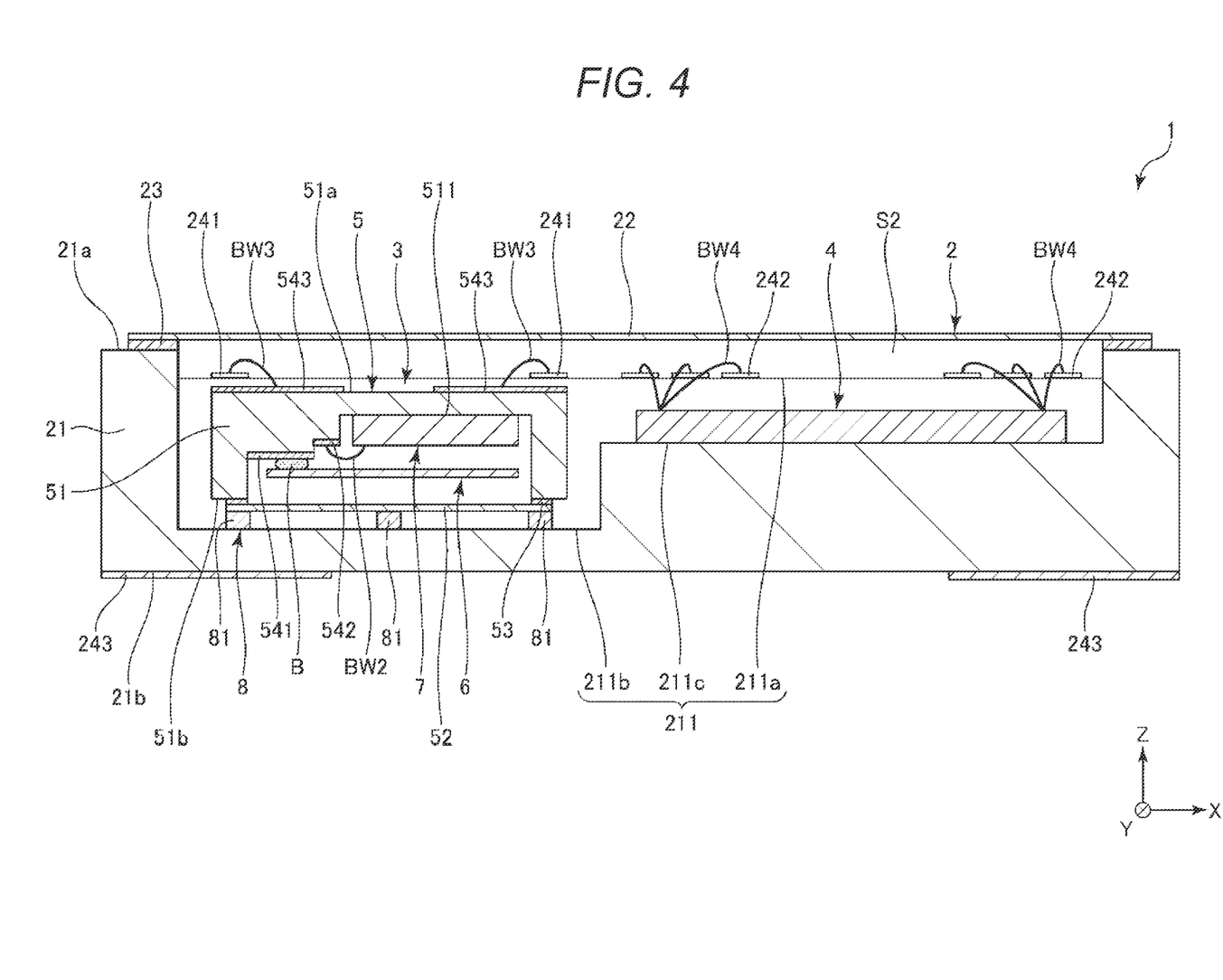
FIG. 4 is a cross-sectional view showing an oscillator according to a second embodiment.

FIG. 4 is a cross-sectional view showing an oscillator according to a second embodiment.

The embodiment is the same as the first embodiment described above except that the configuration of the outer package 2 is different. In the following description, the present embodiment will be described focusing on differences from the above described embodiment, and description of the same matters will be omitted. In FIG. 4, the same components as those of the above described embodiment are denoted by the same reference numerals.

As shown in FIG. 4, in the oscillator 1 according to the present embodiment, the second base substrate 21 includes the recess 211 that is the second recess that opens to the upper surface 21*a*. The second lid 22 is bonded to the upper surface 21*a* of the second base substrate 21 so as to close the recess 211. By closing an opening of the recess 211 with the second lid 22 in this manner, an airtight second accommodation space S2 is formed inside the outer package 2. The temperature compensated crystal oscillator 3 and the second circuit element 4 are accommodated in the second accommodation space S2.

The recess 211 includes a plurality of recesses, and includes the recess 211a that opens to the upper surface 21a and the recess 211b and a recess 211c that opens to the bottom surface of the recess 211a and has an opening smaller than that of the recess 211a. The recesses 211b and 211c are formed side by side in the X-axis direction, and a depth of the recess 211b is greater than a depth of the recess 211c. Therefore, the bottom surface of the recess 211b is located below the bottom surface of the recess 211c. A thickness of a portion of the second base substrate 21 overlapping the recess 211b is smaller than a thickness of a portion of the second base substrate 21 overlapping the recess 211c.

The second circuit element 4 is fixed to the bottom surface of the recess 211c. The temperature compensated crystal oscillator 3 is fixed to the bottom surface of the recess 211b. In a plan view, the second circuit element 4 and the temperature compensated crystal oscillator 3 are disposed side by side in the X-axis direction without overlapping in the Z-axis direction. According to such an arrangement, since both the second circuit element 4 and the temperature compensated crystal oscillator 3 are accommodated in the recess 211, the configuration of the oscillator 1 is simplified as compared with, for example, the configuration in which the second circuit element 4 and the temperature compensated crystal oscillator 3 are accommodated in separate recesses as in the first embodiment described above. In addition, since the second circuit element 4 and the temperature compensated crystal oscillator 3 can be disposed side by side in the X-axis direction without overlapping in the Z-axis direction, it is possible to reduce a height of the outer package 2.

As described above, the outer package 2 includes the second base substrate 21 having the recess 211 which is the second recess that accommodates the inner package 5 and the second circuit element 4, and the second lid 22 bonded to the second base substrate 21 so as to close the opening of the recess 211. Accordingly, both the second circuit element 4 and the temperature compensated crystal oscillator 3 can be accommodated in the recess 211. For example, the configuration of the oscillator 1 is simplified as compared with the configuration in which the second circuit element 4 and the temperature compensated crystal oscillator 3 are accommodated in separate recesses as in the first embodiment described above.

As described above, the inner package 5 and the second circuit element 4 are disposed side by side in the plan view. Accordingly, the second circuit element 4 and the temperature compensated crystal oscillator 3 can be disposed side by side in the X-axis direction without overlapping in the Z-axis direction. Therefore, it is possible to reduce the height of the outer package 2.

According to the second embodiment as described above, the same effects as those of the first embodiment described above can be exerted.

Third Embodiment

Figure 5:
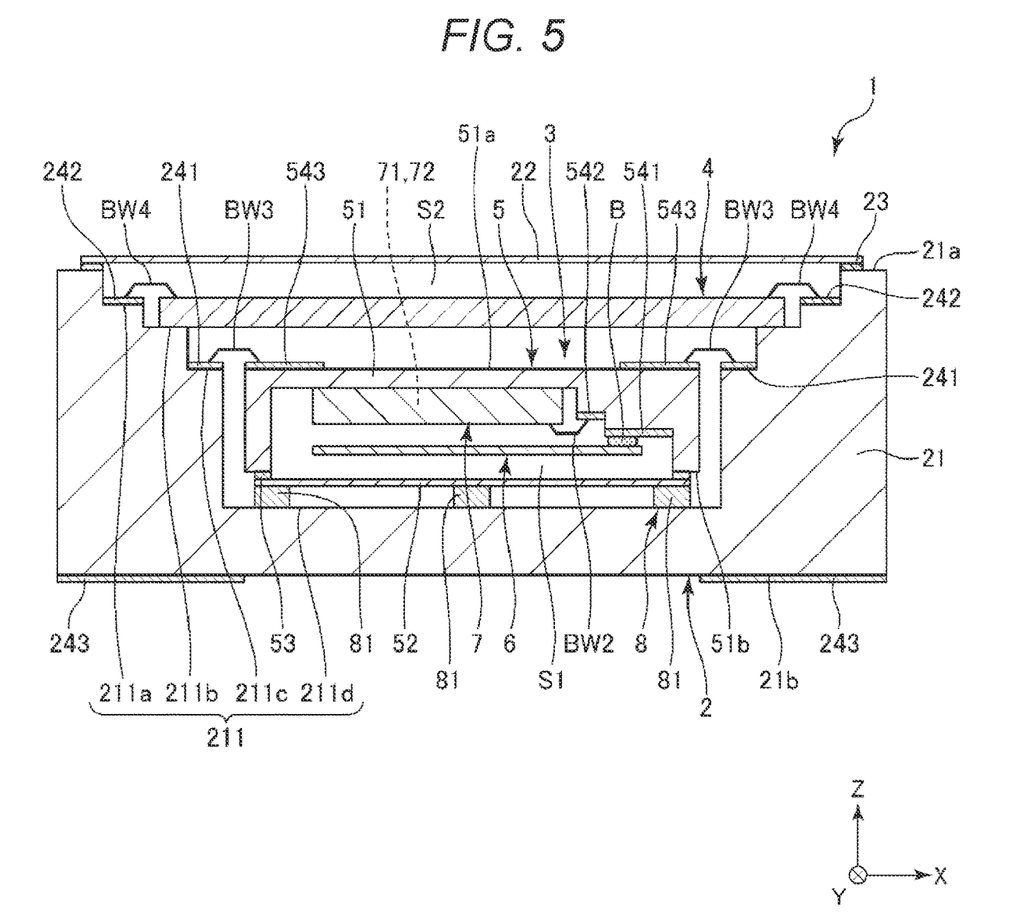
FIG. 5 is a cross-sectional view showing an oscillator according to a third embodiment.

FIG. 5 is a cross-sectional view showing an oscillator according to a third embodiment.

The embodiment is the same as the first embodiment described above except that the configuration of the outer package 2 is different. In the following description, the present embodiment will be described focusing on differences from the above described embodiment, and description of the same matters will be omitted. In FIG. 5, the same components as those of the above described embodiment are denoted by the same reference numerals.

As shown in FIG. 5, in the oscillator 1 according to the present embodiment, the second base substrate 21 includes the recess 211 that is the second recess that opens to the upper surface 21a. The second lid 22 is bonded to the upper surface 21a of the second base substrate 21 so as to close the recess 211. By closing an opening of the recess 211 with the second lid 22 in this manner, an airtight second accommodation space S2 is formed inside the outer package 2. The temperature compensated crystal oscillator 3 and the second circuit element 4 are accommodated in the second accommodation space S2.

The recess 211 includes a plurality of recesses, and includes the recess 211a that opens to the upper surface 21a, the recess 211b that opens to the bottom surface of the recess 211a and has a smaller opening than the recess 211a, the recess 211c that opens to the bottom surface of the recess 211b and has a smaller opening than the recess 211b, and a recess 211d that opens to the bottom surface of the recess 211c and has a smaller opening than the recess 211c.

The second circuit element 4 is fixed to the bottom surface of the recess 211b so as to cover a part or all of the opening of the recess 211c. The temperature compensated crystal oscillator 3 is fixed to the bottom surface of the recess 211d. According to such an arrangement, the second circuit element 4 and the temperature compensated crystal oscillator 3 can be disposed to overlap each other in the Z-axis direction in the outer package 2. Therefore, the second circuit element 4 and the temperature compensated crystal oscillator 3 can be compactly accommodated in the outer package 2, and the oscillator 1 can be miniaturized.

As described above, the outer package 2 includes the second base substrate 21 having the recess 211 which is the second recess that accommodates the inner package 5 and the second circuit element 4, and the second lid 22 bonded to the second base substrate 21 so as to close the opening of the recess 211. Accordingly, the second circuit element 4 and the temperature compensated crystal oscillator 3 can be accommodated in one recess 211, and the configuration of the oscillator 1 is simplified as compared with, for example, the configuration in which the second circuit element 4 and the temperature compensated crystal oscillator 3 are accommodated in separate recesses as in the first embodiment described above.

As described above, the inner package 5 and the second circuit element 4 are disposed to overlap each other in the plan view. Accordingly, miniaturization of the oscillator 1 can be achieved.

According to the third embodiment as described above, the same effects as those of the first embodiment described above can be exerted.

Fourth Embodiment

Figure 6:
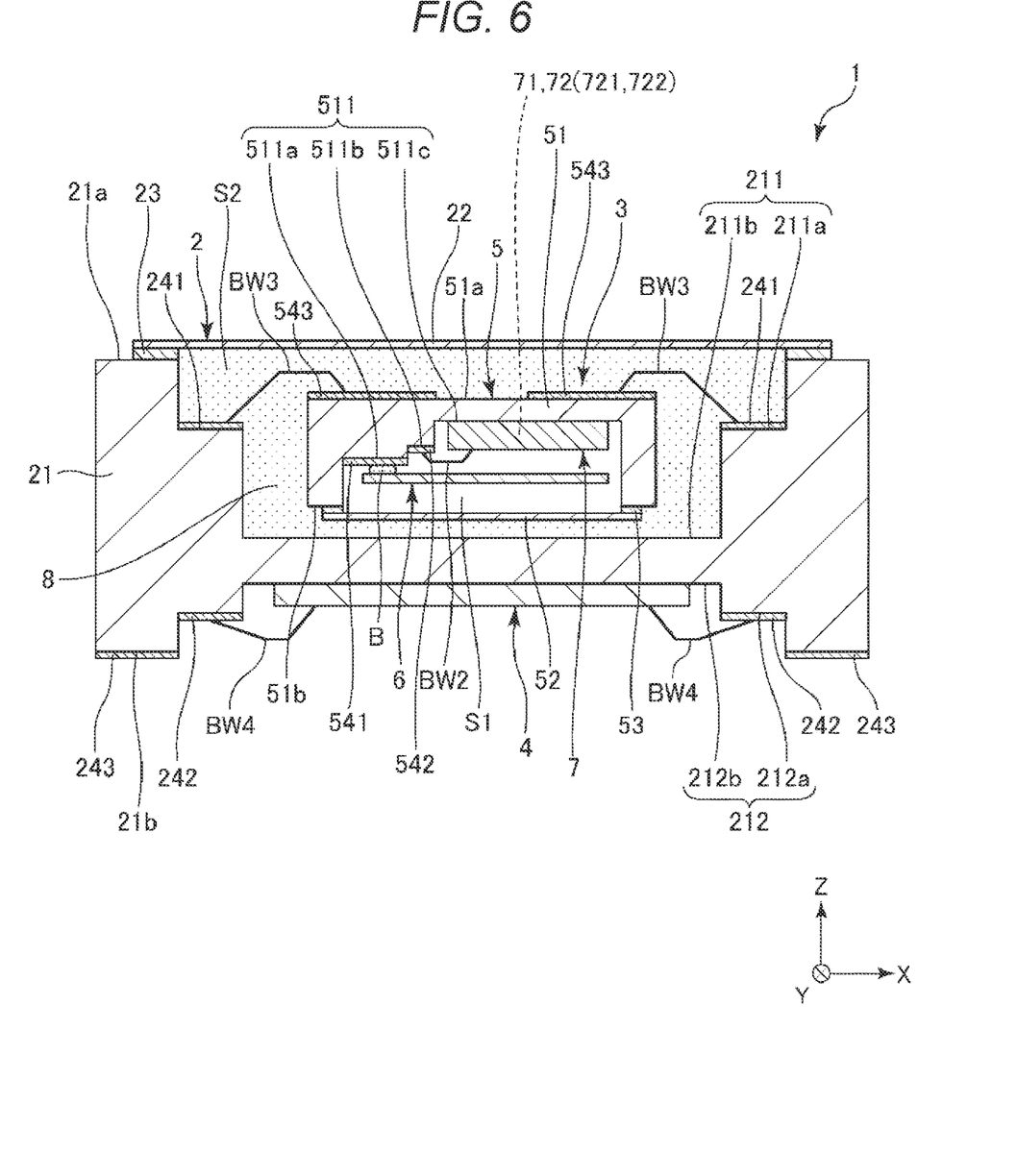
FIG. 6 is a cross-sectional view showing an oscillator according to a fourth embodiment.

FIG. 6 is a cross-sectional view showing an oscillator according to a fourth embodiment.

The present embodiment is the same as the first embodiment described above except that the arrangement of the heat insulating member 8 is different. In the following description, the present embodiment will be described focusing on differences from the above described embodiment, and description of the same matters will be omitted. In FIG. 6, the same components as those of the above described embodiment are denoted by the same reference numerals.

As shown in FIG. 6, in the oscillator 1 according to the present embodiment, the heat insulating member 8 is filled in a second accommodation space S2 which is a space in which the inner package 5 of the outer package 2 is accommodated. That is, the heat insulating member 8 is disposed substantially without a gap in the second accommodation space S2. An entire circumference of the inner package 5 is covered with the heat insulating member 8. Accordingly, the inner package 5 can be more firmly fixed to the outer package 2, and a mechanical strength of the oscillator 1 is increased.

According to the fourth embodiment as described above, the same effects as those of the first embodiment described above can be exerted.

As mentioned above, although the oscillator according to the disclosure is described based on illustrated embodiments, the disclosure is not limited thereto. A configuration of each part can be replaced with any configuration having a similar function. Further, any other constituents may be added to the present disclosure. Further, each of the above described embodiments may be combined as appropriate.

What is claimed is:

1. An oscillator comprising:
an outer package;
an inner package accommodated in the outer package and fixed to the outer package via a heat insulating member;
a vibration element accommodated in the inner package;
a first circuit element accommodated in the inner package and including a temperature sensor and an oscillation circuit configured to oscillate the vibration element and generate a temperature-compensated oscillation signal based on the temperature sensor; and
a second circuit element fixed to the outer package and including a frequency control circuit configured to control a frequency of the oscillation signal,
wherein the second circuit element overlaps with an entirety of the inner package in a plan view.

2. The oscillator according to claim 1, wherein the inner package and the second circuit element are disposed apart from each other.

3. The oscillator according to claim 1, further comprising:
a conductive wire electrically coupling the outer package and the inner package.

4. The oscillator according to claim 1, wherein the outer package includes
a second base substrate having a second recess accommodating the inner package, and a third recess accommodating the second circuit element and open to a surface opposite to a surface on which the second recess opens, and
a second lid bonded to the second base substrate so as to close an opening of the second recess.

5. The oscillator according to claim 1, wherein the outer package includes
a second base substrate having a second recess accommodating the inner package and the second circuit element, and
a second lid bonded to the second base substrate so as to close an opening of the second recess.

6. The oscillator according to claim 5, wherein the inner package and the second circuit element are disposed side by side in a plan view.

7. The oscillator according to claim 1, wherein a space of the outer package in which the inner package is accommodated is in a depressurized state.

8. The oscillator according to claim 1, wherein the heat insulating member is filled in a space of the outer package in which the inner package is accommodated.

9. The oscillator according to claim 1, wherein the inner package includes:
a first base substrate having a first recess accommodating the vibration element and the first circuit element; and
a first lid bonded to the first base substrate so as to close an opening of the first recess,
the vibration element is fixed to the first base substrate, and
the first lid is fixed to the outer package via the heat insulating member.

10. The oscillator according to claim 9, wherein the inner package includes an external terminal disposed on a surface of the first base substrate opposite to a surface to which the first lid is bonded.

11. An oscillator comprising:
an outer package;
an inner package accommodated in the outer package and fixed to the outer package via a heat insulating member;
a vibration element accommodated in the inner package;
a first circuit element accommodated in the inner package and including a temperature sensor and an oscillation circuit configured to oscillate the vibration element and generate a temperature-compensated oscillation signal based on the temperature sensor; and
a second circuit element fixed to the outer package and including a frequency control circuit configured to control a frequency of the oscillation signal,
wherein the inner package includes:
a first base substrate having a first recess accommodating the vibration element and the first circuit element; and
a first lid bonded to the first base substrate so as to close an opening of the first recess,
the vibration element is fixed to the first base substrate, and
the first lid is fixed to the outer package via the heat insulating member.

12. The oscillator according to claim 11, wherein the inner package includes an external terminal disposed on a surface of the first base substrate opposite to a surface to which the first lid is bonded.

13. The oscillator according to claim 11, wherein the inner package and the second circuit element are disposed apart from each other.

14. The oscillator according to claim 11, further comprising:
a conductive wire electrically coupling the outer package and the inner package.

15. The oscillator according to claim 11, wherein the outer package includes:
a second base substrate having a second recess accommodating the inner package, and a third recess accommodating the second circuit element and open to a surface opposite to a surface on which the second recess opens; and
a second lid bonded to the second base substrate so as to close an opening of the second recess.

16. The oscillator according to claim 11, wherein the outer package includes:
a second base substrate having a second recess accommodating the inner package and the second circuit element; and
a second lid bonded to the second base substrate so as to close an opening of the second recess.

17. The oscillator according to claim 16, wherein the inner package and the second circuit element are disposed side by side in a plan view.

18. The oscillator according to claim 11, wherein the inner package and the second circuit element are disposed to overlap each other in a plan view.

19. The oscillator according to claim 11, wherein a space of the outer package in which the inner package is accommodated is in a depressurized state.

* * * * *